United States Patent [19]
Angelopoulos et al.

[11] Patent Number: 6,025,057
[45] Date of Patent: Feb. 15, 2000

[54] ORGANIC ELECTRONIC PACKAGE AND METHOD OF APPLYING PALLADIUM-TIN SEED LAYER THERETO

[75] Inventors: Anastasios Peter Angelopoulos; Gerald Walter Jones, both of Apalachin; Richard William Malek, Johnson City, all of N.Y.; Heike Marcello, Brackney, Pa.; Jeffrey McKeveny, Endicott, N.Y.

[73] Assignee: International Business Machines Corporation, Armonk, N.Y.

[21] Appl. No.: 08/992,700

[22] Filed: Dec. 17, 1997

[51] Int. Cl.$^7$ .................................................. B32B 9/00
[52] U.S. Cl. ........................... 428/209; 430/14; 430/16; 430/18; 427/305; 428/901; 174/258
[58] Field of Search .................. 428/209, 901; 430/280.1, 14, 16, 18; 427/305; 174/258

[56] References Cited

U.S. PATENT DOCUMENTS

| | | | |
|---|---|---|---|
| 4,478,883 | 10/1984 | Bupp et al. | 427/305 |
| 4,554,182 | 11/1985 | Bupp et al. | 427/305 |
| 4,956,197 | 9/1990 | Babu et al. | 427/39 |
| 5,026,624 | 6/1991 | Day et al. | 430/280.1 |
| 5,183,692 | 2/1993 | Mukerji et al. | 427/304 |
| 5,264,325 | 11/1993 | Allen et al. | 430/280.1 |
| 5,374,454 | 12/1994 | Bickford et al. | 427/306 |
| 5,667,934 | 9/1997 | Markovich et al. | 430/280.1 |

*Primary Examiner*—Timothy Speer
*Assistant Examiner*—Cathy F. Lam
*Attorney, Agent, or Firm*—Richard M. Goldman; Lawrence R. Fraley

[57] ABSTRACT

A method of fabricating an electronic package having an organic substrate. The substrate is formed of fiberglass and epoxy. In order to additively circuitize the electronic package substrate, an organic polyelectrolyte is deposited onto the organic substrate. A colloidal palladium-tin seed layer is deposited atop the organic polyelectrolyte. This is followed by depositing a photoimageable polymer atop the seed layer, and photolithographically patterning the photoimageable polymer to uncover portions of the seed layer. The uncovered portions of the seed layer are catalytic to the electroless deposition of copper. In this way a conductive layer of copper is deposited atop the uncovered seed layer. The organic polyelectrolyte is deposited from an aqueous solution at the pH appropriate for the desired seed catalyst coating, depending on the ionizable character of the particular polyelectrolyte employed.

5 Claims, 1 Drawing Sheet

ADJUSTING THE PH OF THE
POLYELECTROLYTE SOLUTION (1)

DEPOSITING THE PH ADJUSTED
POLYELECTROLYTE SOLUTION ONTO A
DIELECTRIC SUBSTRATE (3)

DEPOSITING THE COLLOIDAL PD/SN SEED
ATOP THE POLYELECTROLYTE LAYER (5)

THEREAFTER DEPOSITING A PHOTORESIST
LAYER ATOP THE SEED LAYER (7)

PHOTOLITHOGRAPHICALLY TREATING THE
PHOTORESIST LAYER TO UNCOVER THE
PD/SN SEED LAYER (9)

ADDITIVELY PLATING THE COPPER
CIRCUITIZATION ATOP THE UNCOVERED
PD/SN SEED LAYER (11)

STRIPPING OFF THE REMAINING
PHOTORESIST AND REMOVING UNCOVERED
PD/SN SEED AND POLYELECTROLYTE NOT
OVERLAID WITH CU CIRCUITIZATION
(13)

ADJUSTING THE PH OF THE
POLYELECTROLYTE SOLUTION (1)

DEPOSITING THE PH ADJUSTED
POLYELECTROLYTE SOLUTION ONTO A
DIELECTRIC SUBSTRATE (3)

DEPOSITING THE COLLOIDAL PD/SN SEED
ATOP THE POLYELECTROLYTE LAYER (5)

THEREAFTER DEPOSITING A PHOTORESIST
LAYER ATOP THE SEED LAYER (7)

PHOTOLITHOGRAPHICALLY TREATING THE
PHOTORESIST LAYER TO UNCOVER THE
PD/SN SEED LAYER (9)

ADDITIVELY PLATING THE COPPER
CIRCUITIZATION ATOP THE UNCOVERED
PD/SN SEED LAYER (11)

STRIPPING OFF THE REMAINING
PHOTORESIST AND REMOVING UNCOVERED
PD/SN SEED AND POLYELECTROLYTE NOT
OVERLAID WITH CU CIRCUITIZATION
(13)

ORGANIC ELECTRONIC PACKAGE AND METHOD OF APPLYING PALLADIUM-TIN SEED LAYER THERETO

FIELD OF THE INVENTION

The invention relates to organic electronic packages, referred to herein as electronic packages, such as chip carriers, printed circuit boards, printed circuit cards, accessory cards, and the like, and more particularly to such electronic packages where a conductive layer, as a copper conductive layer, is deposited atop a seed layer, as a palladium-tin seed layer. This seed layer should be thick enough to be surface catalytic for seeding or catalyzing the deposition and growth of the copper, i.e., a seed coverage (expressed in micrograms per square centimeter or ug/cm$^2$, but thin enough to both (1) be removable at the end of the fabrication process, and (2) be resistant to separation during electronic package fabrication. According to the invention, appropriate seed coverage is provided by depositing the seed layer onto a layer, film, or coating of an organic polymer having ionizable groups, that is, a polyelectrolyte, at a suitable pH. The polyelectrolyte may be a polyampholyte, that is, a polymer containing both positive and negative charges, but must contain at least one ionizable group of opposite charge to that of the seed particles in aqueous solution. Although strong ionizable groups, with a charge virtually independent of pH, may be used, the presence of weakly ionizable groups of either positive or negative charge permits greater control of seed deposition as a function of the pH of the polyelectrolyte solution.

BACKGROUND OF THE INVENTION

The seed layer is a very thin layer of metal, e.g., Pd, on a polymeric substrate, capable of acting as a surface catalyst for the plating of Cu thereon. Thus, a very critical aspect of additive plating is the seed layer. If the seed layer is too thin, it will not be catalytic for the electroless deposition of copper, while if it is too thick, it will be resistant to removal at the end of the fabrication process and may lead to resist adhesive failure during the fabrication process. The adsorption of polyelectrolytes, especially cationic polyelectrolytes, onto electronic package substrate surfaces, enhances the adsorption of colloidal Pd/Sn particles thereto, which, in turn catalyzes the electroless deposition of copper cirduitization onto electronic package surfaces. In a typical process sequence an organic polymer having pendant ionizable groups, i.e., a polyelectrolyte, is adsorbed from solution onto an electronic package substrate, followed by adsorption of colloidal Pd/Sn as a seed layer. A photoresist is applied atop the seed layer and photolithographically imaged to uncover the regions of the seed layer to be circuitized. Copper is electrolessly applied to the photolithographically uncovered seed layer. The uncovered Pd reduces Cu in the electroless plating bath to form the circuitization. The remaining photoresist is removed, i.e., stripped, and the remaining uncovered seed and polyelectrolyte are removed, leaving only residual seed and polyelectrolyte underlying the Cu circuitization.

A key requirement of the process is to achieve the appropriate Pd/Sn seed catalyst loading. Insufficient Pd catalyst will result in voids in the copper deposit, creating open circuits. Too much catalyst can cause both adhesive failure and lateral conduction. Adhesive failure permits the electroless plating solution to leak beneath the photoresist and deposit copper between circuit elements, causing short circuits.

Deposition of the Pd/Sn seed or catalyst layer depends critically on the adsorbed polyelectrolyte. The Pd/Sn colloidal particles do not appreciably adsorb on the electronic package substrate surface, that is, on the untreated electronic package surface. Thus, a need exists to controllably enhance the adsorption of colloidal Pd/Sn particles onto the electronic package substrate.

OBJECTS OF THE INVENTION

It is an object of the invention to provide a polyelectrolyte treatment for electronic package substrates that is catalytic for forming a film of Pd/Sn seed that is catalytic for copper deposition.

SUMMARY OF THE INVENTION

These and other objects are achieved by the method and structure of our invention. One aspect of the invention is a method of fabricating an electronic package having an organic substrate. Typically the substrate is formed of fiberglass and epoxy. In order to additively circuitize the electronic package substrate, an organic polymer having ionizable groups, i.e., an organic polyelectrolyte, is deposited onto the organic substrate. A colloidal palladium-tin seed layer is deposited atop the organic polyelectrolyte. This is followed by depositing a photoimeagable polymer atop the seed layer, and photolithographically patterning the photoimageable polymer to uncover portions of the seed layer to be circuitized. The uncovered portions of the seed layer are catalytic to the electroless deposition of copper. In this way a conductive layer of copper is deposited atop the uncovered seed layer. After circuitization the remaining photoresist is removed, i.e., stripped, and the uncovered seed layer and polyelectrolyte removed, leaving residual Pd/Sn seed and polyelectrolyte under the Cu circuitization. According to our invention the organic polyelectrolyte is deposited from an aqueous solution having the pH adjusted according to the chemical structure of the polyelectrolyte (when weakly acidic or basic pendant groups are present) such as to achieve optimum catalyst loading.

A further embodiment of the invention is an organic electronic package characterized by at least one circuitization carrying layer formed of a photoimageable dielectric. In this embodiment the electronic package has an circuitization encapsulated in a photoimageable dielectric. The photoimageable dielectric is coated with a thin film of an organic polymer having ionizable groups, i.e., an organic polyelectrolyte thereon. This organic polyelectrolyte underlies the palladium-tin seed layer. The seed layer is characterized by a seed coverage of (i) less than 8 micrograms per square centimeter of palladium and (ii) less than 2 micrograms per square centimeter of tin, but thick enough. to catalyze copper circuitization deposition. The seed layer catalyzes deposition of the copper wiring. The resulting copper circuitization is atop the photoimageable dielectric.

THE FIGURE

The FIGURE is a flow chart of one embodiment of our invention. The FIGURE shows the steps of adjusting the pH of the polyelectrolyte solution (1), depositing the pH adjusted polyelectrolyte solution onto a dielectric substrate (3), depositing the colloidal Pd/Sn seed atop the polyelectrolyte layer (5), thereafter depositing a photoresist layer atop the seed layer (7), photolithographically treating the photoresist layer to uncover the Pd/Sn seed layer (9), additively plating the copper circuitization atop the uncovered Pd/Sn seed layer (11), and thereafter stripping off the remaining photoresist and removing uncovered Pd/Sn seed and polyelectrolyte not overlaid with Cu. circuitization (13).

DETAILED DESCRIPTION OF THE INVENTION

One aspect of our invention is a method of fabricating an electronic package having an organic substrate. Typically the substrate is formed of fiberglass and epoxy. The epoxy is typically bisphenol A based, containing epoxidized cresol novolac and initiated with an imidazole catalyst.

In order to additively circuitize the electronic package substrate, an organic polymer having ionizable groups, i.e., an organic polyelectrolyte, is deposited onto the organic substrate. In one exemplification of our invention this is a copolymer of (1) acrylamide and (2) beta-methacryloxyethyltrimethyl ammonium methyl sulfate, referred to as AM/MTMMS, and having the structure

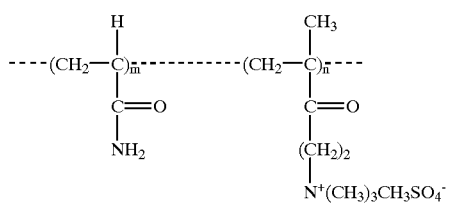

where the ratio n/m is about 0.1, the molecular weight by gel permeation is about 2 Mdaltons.

Associated with this chemical structure may be a degree of hydrolyzed amide groups (typically 10 percent of the amide groups are hydrolyzed) present as carboxylic acid or the salt of the carboxylate anion. This polyelectrolyte is deposited onto the organic substrate in an aqueous solution containing sulfuric acid at a pH below 4. The acidic solution assures that the hydrolyzed pendant groups do not ionize and that only cations are present on the polyelectrolyte backbone. The polyelectrolyte is typically present at a concentration of between 0.2 and 1.2 grams per liter.

A further embodiment of this invention is deposition of the above polyelectrolyte onto the organic substrate in an aqueous solution containing sodium hydroxide at a pH above 10. The alkaline solution ensures complete ionization of the weakly acidic hydrolyzed groups and produces an ampholyte containing both positive and negative groups. Polyelectrolyte concentration is typically again between 0.2 and 1.2 grams per liter.

Another polyelectrolyte is a cationic polyamide-amine, which contains only cations on the polyelectrolyte backbone which do not vary with solution pH and has no pendant weakly acidic or weakly basic groups. A neutral aqueous solution is typically employed with a polyelectrolyte concentration again of between 0.2 and 1.2 grams per liter.

A colloidal palladium-tin seed layer is deposited atop the organic polyelectrolyte. This is followed by depositing a photoimageable polymer atop the seed layer, and photolithographically patterning the photoimageable polymer to uncover portions of the seed layer. The uncovered portions of the seed layer are catalytic to the electroless deposition of copper. In this way a conductive layer of copper is deposited atop the uncovered seed layer.

The seed layer is a Pd/Sn colloidal suspension prepared by mixing 100 grams of $SnCl_2$, 2 grams of $PdCl_2$, 175 grams of NaCl, 0.1 grams of 3M Corporation FC-95 fluorocarbon surfactant, and 200 milliliters of 37% HCl in 1 liter of water.

After depositing the seed layer, a photoimageable polymer is deposited, i.e., a photo resist. The resist is photo-lithographically processed to uncover seed layer in the intended pattern of the circuitization, and Cu is electrolessly deposited on the uncovered seed layer. The photoresist is then stripped. The uncovered seed and polyelectrolyte are removed, leaving residues thereof overlaid by the Cu circuitization.

According to a particularly preferred alternative embodiment of the invention, a photoimageable dielectric is deposited atop a patterned conductive layer, thereby encapsulating the circuitization, and photoimaged. Photoimaging can include photo formation of vias. This photoimageable dielectric is, typically, an epoxy resin system of a polyol resin condensation product of (i) an epihalohydrin and (ii) an epoxidized octafunctional bisphenol A formaldehyde novolac resin. Where flame retardant properties are desired, it can include an epoxidized glycidyl ether of tetrabromo bisphenol A. This photoimageable dielectric is typically deposited to a thickness of up to about 20 mils, generally from about 1 mil to 20 mils, and preferably from about 2 mils to about 20 mils. A polyelectrolyte is deposited as described hereinabove. In this preferred embodiment of the invention the colloidal palladium-tin seed layer is deposited to a seed coverage of less than 8 micrograms per square centimeter of Pd and less than 2 micrograms per square centimeter of Sn atop the organic polyelectrolyte.

A further embodiment of the invention is an organic electronic package characterized by at least circuitization carrying layer formed of a photoimageable dielectric. In this embodiment the electronic package has a circuitized organic substrate. The circuitization is encapsulated in a photoimageable dielectric. The photoimageable dielectric is roughened and coated with a layer of an organic polymer having ionizable groups, i.e., an organic polyelectrolyte. This organic polyelectrolyte underlies the palladium-tin seed layer. The seed layer is characterized by a seed coverage of (i) less then 8 micrograms per square centimeter of palladium and (ii) less then 2 micrograms per square centimeter of tin. The seed layer is catalytic for deposition of the copper wiring, that is, the seed layer underlies a patterned or circuitized conductive layer after the processing shown in the FIGURE and described hereinabove. The photoimageable dielectric layer is adapted to also carry circuitization.

The photoimageable dielectric is preferably an epoxy resin system of a polyol resin condensation product of (i) an epihalohydrin and (ii) an epoxidized octafunctional bisphenol A formaldehyde novolac resin. The system can further include an epoxidized glycidyl ether of tetrabromo bisphenol A. This layer typically has a thickness of from about 2 mils to about 20 mils.

EXAMPLES

The invention can be understood by reference to the following examples.

Example 1

Two epoxy-glass panels that had been previously roughened were dipped for 2 minutes into aqueous solutions containing 0.05% (grams/gram) of AM/MTMMS. One solution was prepared with 2% (volume/volume) sulfuric acid and the other with 0.3 N sodium hydroxide.

The panels were rinsed, seeded in a colloidal Pd/Sn bath, rinsed, accelerated in a sodium hydroxide bath, rinse, and hot air dried. Coupons were taken from each panel for seed analysis. The panels were laminated with DuPont T-168 photoresist, exposed, and developed. The seed bearing laminate was exposed in areas where electroless copper plating was to occur. Both panels were plated to about 1.7 mils with copper. The resist was stripped in a normal manner and both parts were tested for leakage.

The panel processed in the acidic solution of AM/MTMMS had more than 50 leakage current nets which exhibited leakage whereas the panel processed in the basic solution had only three leakage current nets. Seed analysis confirmed that the acid processed panel had a Pd/Sn ratio of 5.2/0.9 ug/cm$^2$ whereas the basic processed panel had a Pd/Sn ratio of 4.0/0.7 ug/cm$^2$.

Seed retention is even more affected by this treatment if the epoxy-glass panel material is hole cleaned in standard permanganate chemistry prior to seed. Hole cleaned samples seeded with acidic AM/MTMMS had a Pd/Sn ratio of 6.7/2.0 (micrograms per square centimeter/micrograms per square centimeter) whereas those seeded with pH 12 or greater AM/MTMMS had a 1.9/0.5 ug/cm$^2$ ratio.

Example 2

A dielectric layer of 2.8 mil dry film of a photoimeagable dielectric formed of a polyol resin of (1) an epichlorohydrin and (2) an epoxidized octafunctional bisphenol A formaldehyde novolac resin was laminated to an epoxy-glass panel laminate that had previously been stripped of copper. The photoimageable dielectric was exposed and cured to produce a panel suitable for studying seed uptake on a photoimageable dielectric surface. The panel was imaged and was then surface roughened to ensure good copper to dielectric adhesion. Coupons were taken from this core and prepared for electroless copper deposition as described below.

A 0.05% solution of AM/MTMMS containing 3.0% (v/v) of sulfuric acid was prepared. A second solution was prepared which contained 0.05% AM/MTMMS and 0.1N sodium hydroxide. One coupon was dipped in the acidic solution of AM/MTMMS for 2 minutes followed by a 1 min deionized water rinse. The coupon was then immersed in a colloidal Pd/Sn seed bath for 3 minutes, followed by a 1 minute deionized water rinse and then treatment in a 0.5 N sodium hydroxide acceleration bath followed by a final 1 min deionized water rinse. The other coupon was treated in the same manner except the 0.05% basic AM/MTMMS solution was used. The coupons were air dried.

The acidic AM/MTMMS solution had a Pd/Sn ratio of 17.6/13.2 ug/cm$^2$ whereas the basic solution had a ratio of 8.0/1.9 ug/cm$^2$.

While the invention has been described with respect to certain preferred embodiments and exemplifications, it is not intended to limit the scope of the invention thereby, but solely by the claims appended hereto.

We claim:

1. An organic electronic package comprising:
   a. an organic substrate having a first conductive circuit layer thereon;
   b. a photoimageable dielectric atop the first conductive circuit layer;
   c. organic polyelectrolyte on the photoimageable dielectric;
   d. palladium-tin seed having a seed layer coverage of (i) less than 8 micrograms per square centimeter of palladium and (ii) less than 2 micrograms per square centimeter of tin atop the organic polyelectrolyte layer; and
   e. a second conductive circuit layer atop the palladium-tin seed layer, said photoimageable dielectric remaining on said first conductive circuit layer of said organic electronic package.

2. The organic electronic package of claim 1 wherein the photoimageable dielectric comprises an epoxy resin system of a polyol resin condensation product of (i) an epihalohydrin and (ii) an epoxidized octafunctional bisphenol A formaldehyde novolac resin.

3. The organic electronic package of claim 2 wherein the epoxy resin system further comprises an epoxidized glycidyl ether of tetrabromo bisphenol A.

4. The organic electronic package of claim 1 wherein the photoimageable dielectric has a thickness of less than about 20 mils.

5. The organic electronic package of claim 4 wherein the photoimageable dielectric has a thickness of from about 1 to about 20 mils.

* * * * *